US009167706B2

(12) United States Patent
Holmstrom

(10) Patent No.: US 9,167,706 B2
(45) Date of Patent: Oct. 20, 2015

(54) ELECTRONIC FLIGHT BAG RETENTION DEVICE

(71) Applicant: Steven J. Holmstrom, Bedford, TX (US)

(72) Inventor: Steven J. Holmstrom, Bedford, TX (US)

( * ) Notice: Subject to any disclaimer, the term of this patent is extended or adjusted under 35 U.S.C. 154(b) by 185 days.

(21) Appl. No.: 13/959,023

(22) Filed: Aug. 5, 2013

(65) Prior Publication Data

US 2015/0034686 A1 Feb. 5, 2015

(51) Int. Cl.
*B64D 11/00* (2006.01)
*H05K 5/02* (2006.01)
*B64D 45/00* (2006.01)

(52) U.S. Cl.
CPC .............. *H05K 5/0204* (2013.01); *B64D 45/00* (2013.01); *B64D 2045/0075* (2013.01)

(58) Field of Classification Search
CPC .................. B64D 2045/0075; B64D 2201/00; H05K 5/0204; H05K 7/14
See application file for complete search history.

(56) References Cited

U.S. PATENT DOCUMENTS

| | | | | |
|---|---|---|---|---|
| 3,589,327 A | * | 6/1971 | Jacobs | 116/39 |
| 4,129,897 A | * | 12/1978 | Telewski et al. | 361/757 |
| 4,577,788 A | * | 3/1986 | Richardson | 224/483 |
| 4,846,382 A | * | 7/1989 | Foultner et al. | 224/483 |
| 4,962,874 A | * | 10/1990 | Hagglund | 224/277 |
| 4,969,623 A | * | 11/1990 | Bernier | 248/441.1 |
| 5,016,147 A | * | 5/1991 | Voorhees | 362/99 |
| 5,348,268 A | * | 9/1994 | Klein | 248/681 |
| 5,441,229 A | * | 8/1995 | Spagnoli | 248/452 |
| 5,996,956 A | * | 12/1999 | Shawver | 248/309.1 |
| 6,588,719 B1 | | 7/2003 | Tubach | |
| 7,686,250 B2 | | 3/2010 | Fortes et al. | |
| 7,886,903 B1 | * | 2/2011 | Wurzelbacher et al. | 206/320 |
| 8,020,829 B1 | * | 9/2011 | Tamayori | 248/447.2 |
| 8,120,913 B2 | | 2/2012 | Wicks | |
| 8,215,583 B2 | | 7/2012 | Groomes et al. | |
| 8,231,081 B2 | | 7/2012 | Fortes et al. | |
| 8,308,114 B2 | | 11/2012 | DeBuhr et al. | |
| 2007/0045365 A1 | * | 3/2007 | Guo et al. | 224/275 |
| 2009/0032421 A1 | * | 2/2009 | Sween et al. | 206/320 |
| 2009/0032667 A1 | * | 2/2009 | Sween et al. | 248/346.03 |
| 2009/0230161 A1 | * | 9/2009 | Emsky | 224/257 |
| 2010/0278415 A1 | | 11/2010 | Liege et al. | |
| 2011/0084106 A1 | | 4/2011 | Bopp et al. | |
| 2011/0101058 A1 | | 5/2011 | Heckman | |
| 2011/0270469 A1 | | 11/2011 | Bopp et al. | |
| 2012/0261520 A1 | | 10/2012 | Groomes et al. | |

* cited by examiner

*Primary Examiner* — Brian D Nash
(74) *Attorney, Agent, or Firm* — Richard H. Krukar; Kermit D. Lopez; Luis M. Ortiz

(57) ABSTRACT

An electronic flight bag retention device for use within an airborne vehicle. An electronic flight bag includes a tablet computer that can be retained within an airborne vehicle cockpit by configuring a rigid substrate to retain the electronic flight bag. The rigid substrate can include, for example, three clips upon the edges of the rigid substrate, two of which retain the electronic flight bag. A top edge of the rigid substrate can be angled to form a weight supporting member of the retaining device. Two elongated slots can be formed or cut into the rigid substrate to facilitate a clipboard spring clip insertion through one of the two slots in order to retain the retention device to a cockpit side window clipboard.

18 Claims, 3 Drawing Sheets

ELECTRONIC FLIGHT BAG RETENTION DEVICE

CROSS-REFERENCE TO PROVISIONAL PATENT APPLICATION

This application claims the benefit of U.S. Provisional Patent Application Ser. No. 61/680,065, entitled "Electronic Flight Bag Retention Device", filed on Aug. 6, 2012, and is incorporated herein by reference in its entirety.

TECHNICAL FIELD

Embodiments are generally related to tablet computer retention devices within a vehicle. Embodiments are also related to the field of aviation chart display electronic devices, Electronic Flight Bag devices and the retention devices within aircraft.

BACKGROUND OF THE INVENTION

Airline operations and commercial aircraft operators currently require several flight manuals or navigation charts to be readily available to the pilots during flight. These manuals include, but are not limited to, aircraft systems manuals, procedural manuals, emergency manuals, aeronautical charts and approach charts. The Federal Aviation Administration (FAA) has approved these manuals and charts to be electronically available on electronic devices such as laptop computers and tablet computers meeting their regulations and guidelines.

The FAA has classified the electronic devices, known as an "Electronic Flight Bag" (EFB) into a Class 1, 2 or 3 EFB, and their software applications as Types A, B and C.

The FAA definitions for a Class 1 EFB states: "Class 1 EFBs are portable commercial off-the-shelf (COTS)-based computers, considered to be portable electronic devices (PED) with no FAA design, production, or installation approval for the device and its internal components. Class 1 EFBs are not mounted to the aircraft, connected to aircraft systems for data, or connected to a dedicated aircraft power supply. Class 1 EFBs can be temporarily connected to an existing aircraft power supply for battery recharging. Class 1 EFBs that have Type B applications for aeronautical charts, approach charts, or an electronic checklist must be appropriately secured and viewable during critical phases of flight and must not interfere with flight control movement or pilot egress."

Class 2 EFBs are defined similarly to Class 1 EFBs except that they are typically mounted, and may connect to aircraft power, data ports (wired or wireless), or installed antennas, provided those connections are installed in accordance with FAA AC 20-173. One of the characteristics that current FAA guidance material uses to differentiate Class 1 EFB devices from Class 2 devices is the method used to secure the device during critical phases of flight. Class 1 EFBs are not mounted to the aircraft, whereas Class 2 EFBs are typically mounted. Class 2 EFBs may, however, use a securing device that is not a "Mount".

The FAA defines "mounted" as any portable device (EFB) that is attached to a permanent mounting device. FAA guidance states that an EFB that uses a securing system that is not permanently attached to the aircraft, but is continuously viewable during critical phases of flight, is a Class 1 EFB.

Further FAA requirements for a securing device include that it not obstruct the pilot's primary (forward) and secondary (side) fields of view, does not obstruct or impede emergency egress, does not interfere with crew accomplishment of any flight crew duty or task associated with operating any aircraft system, and does not interfere with the movement of any primary or secondary flight controls.

Currently the Apple iPad family has FAA approval to be used as a Class 1 EFB with a Type B Application during all phases of flight. This application is not intended to exclude or limit other devices which may be approved in the future, such as, but not limited to, the Android tablet devices and other application specific electronic devices. A Class 3 EFB is considered installed equipment and subject to FAA airworthiness certification requirements, and therefore outside of the scope of this application.

A device is required to retain the Class 1 or 2 EFB so that is securable and viewable during all flight phases (including critical phases below 10,000 feet) while also permitting the pilots to view the EFB screen, operate the EFB effectively and actuate all controls of the aircraft while also not blocking any required view from the pilots' perspective. The invention disclosed herein solves the aforementioned problems for both Class 1 EFBs as well as for Class 2 EFBs desiring a non-"Mounted" solution.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings and abstract as a whole.

It is, therefore, one aspect of the present invention to provide for an improved tablet computer retention device.

It is another aspect of the present invention to provide for an improved tablet computer retention device for use within a vehicle.

It is another aspect of the present invention to provide for an improved Electronic Flight Bag (EFB) retention device for use within an aircraft.

The aforementioned aspects and other objectives and advantages can now be achieved as described herein. An Electronic Flight Bag retention device for use within an airborne vehicle is disclosed. An electronic flight bag comprising a tablet computer can be retained within an airborne vehicle cockpit by forming a rigid substrate to retain the electronic flight bag. The rigid substrate can comprise three clips upon the edges of the rigid substrate, two of which retain the electronic flight bag. A top edge of the rigid substrate can be angled to form a weight supporting member of the retaining device. Two elongated slots or apertures can be formed or cut into the rigid substrate sized to facilitate a clipboard spring clip insertion through one of the two slots in order to retain the EFB retention device to a cockpit clipboard. The EFB retention device facilitates the EFB tablet computer to be utilized in either a portrait or a landscape mode.

The EFB retention device has two functions: 1) the EFB retention device securely retains the EFB within the retention device itself and 2) the EFB retention device securely retains the EFB retention device, with or without the EFB installed, to the aircraft clipboard in an appropriate location for use during all phases of flight operations. According to the FAA Advisory Circular (AC No. 120-76A), an Electronic Flight Bag (EFB) is defined thus: "An electronic display system intended primarily for flight deck use that includes the hardware and software necessary to support an intended function. EFB devices can display a variety of aviation data or perform basic calculations (e.g., performance data, fuel calculations, etc.). In the past, some of these functions were traditionally accomplished using paper references or were based on data provided to the flight crew by an airline's "flight dispatch" function. The scope of the EFB system functionality may also include various other hosted databases and applications. Physical EFB displays may use various technologies, formats, and forms of communication. An EFB must be able to host Type A and/or Type B software applications."

Therefore, an Electronic Flight Bag can function as a PED to be utilized during flight. Although directed to an aircraft flight electronic tablet computer retention device, the disclosed invention may also be utilized in other vehicle operations requiring a tablet computer securely retained during operations, including, but not limited to, ground vehicle operations such as automobile, trucking or freight operations and water craft operations.

The EFB retention device disclosed herein comprises a durable, stiff and rigid material shaped to both hold the EFB securely within the retention device and also to allow an easy and simple method of installing and removing the EFB from the retention device. The present invention discloses a single rigid substrate formed into a shape which securely retains the EFB during all phases of flight.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete and will fully convey the scope of the invention to those skilled in the art. Like numbers refer to like elements throughout. As used here, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having meaning that is consistent with their meaning in the context of the relevant art and will not be interpreted in an idealized or overly formal sense unless expressly so defined herein.

Figure 1:
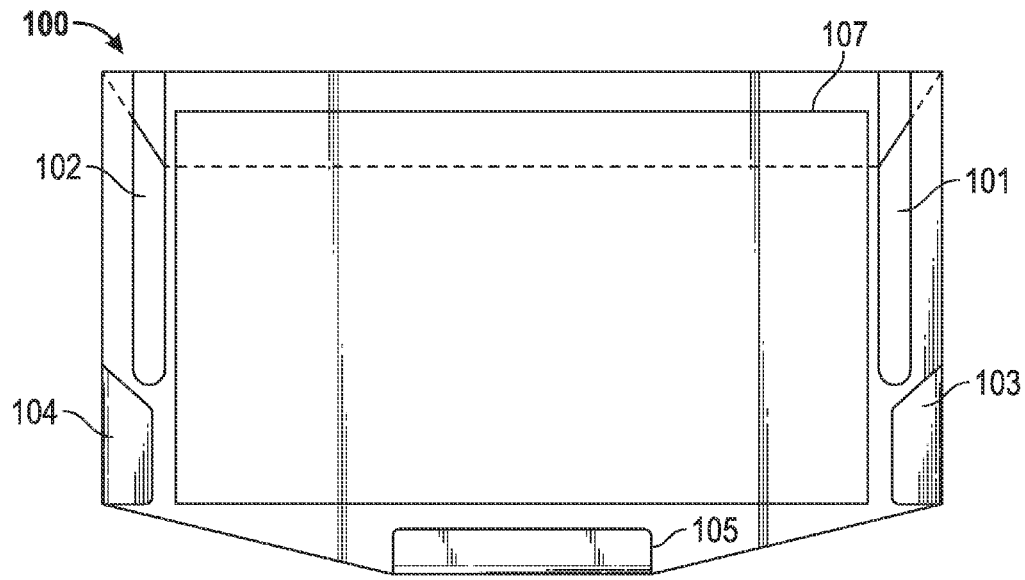
FIG. 1 illustrates an exemplary graphical illustration of an Electronic Flight Bag Retention device, which can be implemented in accordance with a preferred embodiment.

FIG. 1 illustrates a vertical view of the Electronic Flight Bag (EFB) retention device 100, in accordance with a preferred embodiment. The EFB retention device disclosed herein comprises a durable and rigid material or substrate shaped to both hold the EFB securely within the retention device and also to allow an easy and simple method of installing and removing the EFB from the retention device. A non-limiting example of the stiff material of the EFB retention device may be 5003 H3 aluminum or any other suitable material; non-limiting examples of which may include steel, plastic or fiberglass. The retention device is designed to fit onto a clipboard attached to the side window in the cockpit of the aircraft.

The EFB retention device can be shaped such that the aircraft clipboard spring clip fits through the forward slot, either slot 101 or 102; "forward" defined by the direction of the front of the aircraft. Most transport category aircraft include a clipboard comprising a spring clip permanently affixed to the cockpit side window frame on both sides of the cockpit and is not part of the present invention. In an example embodiment on the Boeing 737, the aircraft clip from the clipboard fits through a slot on the forward section of the retention device.

FIG. 1 illustrates 2 side slots 101, 102 wherein the side window spring clip fits through. The EFB retention device only utilizes one side slot 101 or 102 at a time; the other slot formed in the retention device in order to utilize the retention device on the other side of the aircraft making the retention device "reversible" or usable on either the captain or first officer side window clipboard. The aircraft clipboard spring clip fits through the forward slot of the retention device, either slot 101 or 102; "forward" defined by the direction of the front of the aircraft. The forward slot of the retention device 100 is indicated by slot 101 if utilized on the left side of the aircraft and conversely, illustrated by slot 102 if utilized on the right side of the aircraft. As noted above, the EFB retention device 100 may be quickly and easily moved from one side of the cockpit to the other, depending upon whether the retention device 100 is utilized by a Captain or a First Officer (left seat or right seat).

FIG. 1 further illustrates three non-movable retention clips 103, 104 and 105 formed from the rigid durable material edges. These three retention clips 103, 104 and 105 allow the EFB to be installed into the retention device in either the "landscape" or "portrait" modes. The EFB tablet computer is retained in bottom clip 105 and is further securely retained within the retention device 100 by only one of the side clips 103 or 104; depending upon which side of the aircraft the EFB retention device is placed. The three clips 103, 104 and 105 are formed so that the retention device is reversible and useable on either side of the aircraft as only two clips are actually utilized for retention of the EFB.

The EFB retention device further may include a PVC padding 107 applied to the surface of the retention device and to the concave side or inside of each of the three retention clips 103, 104 and 105. The PVC padding 107 provides both protection for the EFB and frictional retention of the EFB within the retention device 100.

Figure 2:
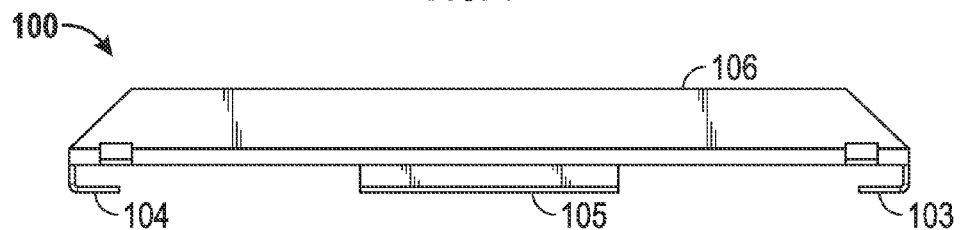
FIG. 2 illustrates an exemplary graphical illustration of a side view of an Electronic Flight Bag Retention device, which can be implemented in accordance with the disclosed embodiments.

FIG. 2 illustrates a side view of the EFB retention device 100. The top edge of the EFB retention device includes a weight support member 106 formed in the rigid material and angled at a non-limiting angle of 60 degrees from the top and back of the retention device. This support member 106 fits behind and above the aircraft side clipboard therein supporting the weight of the combined retention device 100 and EFB and does not obstruct or impinge upon the cockpit side window. The angle of the support member is aircraft or vehicle specific and would necessarily be different for different applications or vehicles. FIG. 2 further illustrates that slots 101 and 102 continue onto weight support member 106.

Figure 3:
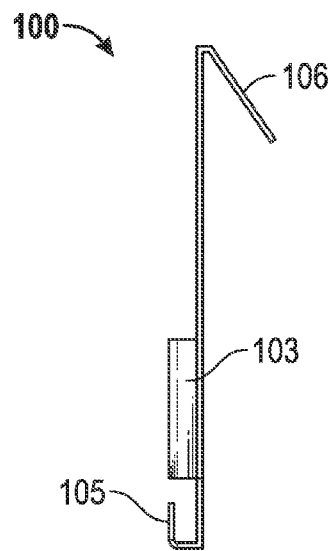
FIG. 3 illustrates an exemplary graphical illustration of a second side view of an Electronic Flight Bag Retention device, which can be implemented in accordance with the disclosed embodiments.

FIG. 3 illustrates a side view of the EFB retention device 100. FIG. 3 further illustrates the side retention clip 103, the bottom retention clip 105 and the weight support member 106.

Figure 4:
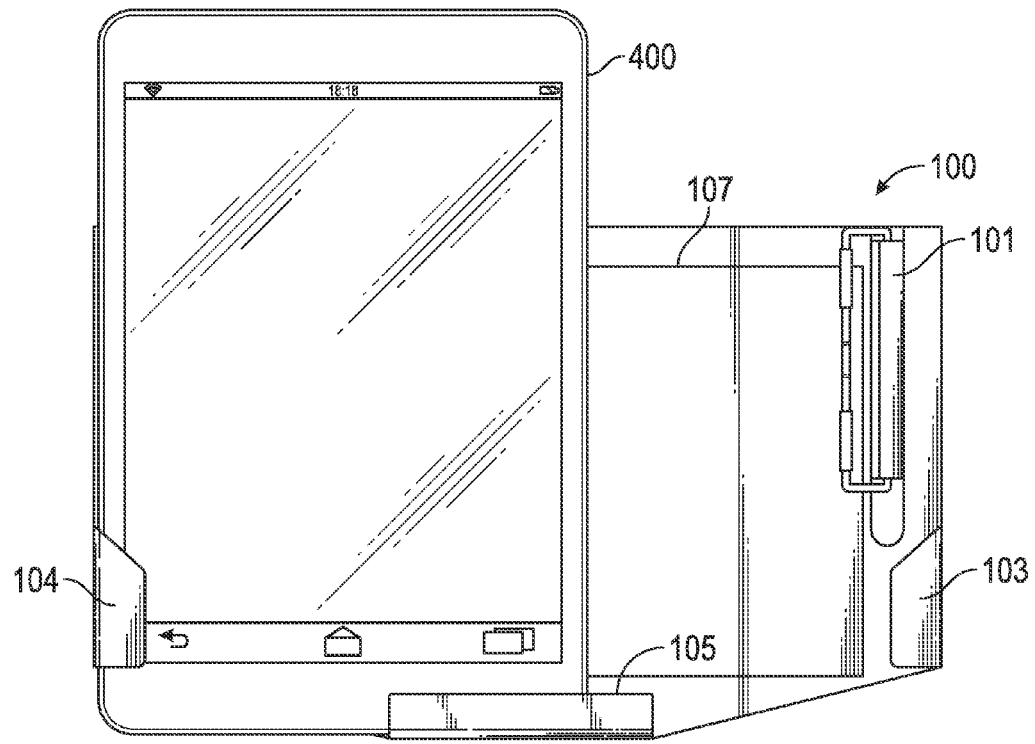
FIG. 4, illustrates an exemplary graphical illustration of a view of the EFB retention device with a tablet computer in "portrait" mode, which can be implemented in accordance with the disclosed embodiments.
Figure 5:
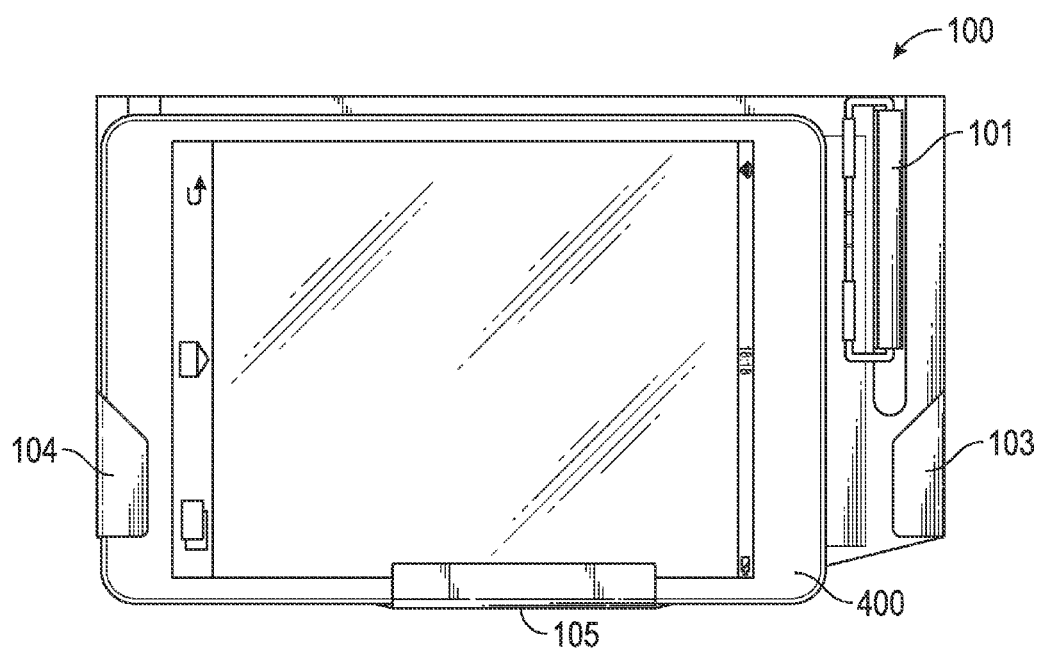
FIG. 5 illustrates an exemplary graphical illustration of a view of the EFB retention device with a tablet computer in "landscape" mode, which can be implemented in accordance with the disclosed embodiments.

FIGS. 4 and 5 illustrate two views of the retention device 100 with a tablet computer EFB installed within the retention device 100. FIG. 4 illustrates the retention device installed on the Captain's side window clipboard with the tablet computer 400 in "portrait" mode whereas FIG. 5 illustrates the tablet computer 400 installed in "landscape" mode. Both FIGS. 4 and 5 illustrate the forward slot 101 with the aircraft spring clip fitted through slot 101 and the spring clip tension applied to the surface of the retention device 100. If the EFB retention device is utilized on the First Officer's side (or right side) of the cockpit, it would appear similarly with the spring clip and tablet computer reversed from the image in FIGS. 4 and 5. With the utilization of the retention device on the right side window clipboard, the aircraft clipboard spring clip would be fitted through slot 102 and the tablet computer would be retained by clip 103. In either case, right side or left side usage, the EFB is retained in bottom clip 105.

Figure 6:
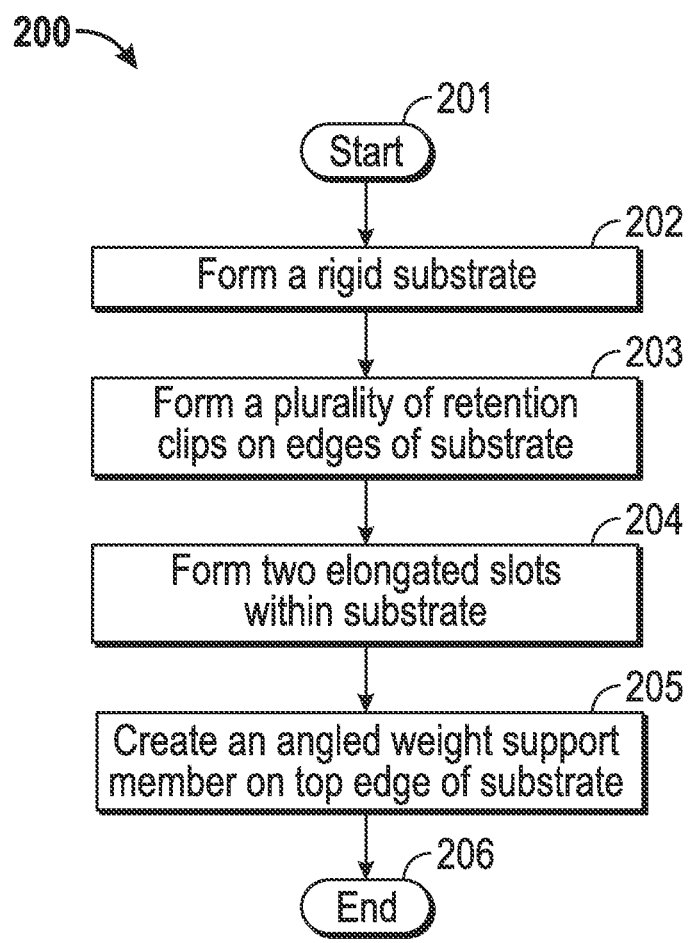
FIG. 6 illustrates an exemplary high level flow chart of operations illustrating logical operational steps of a method for forming an Electronic Flight Bag Retention Device, which can be implemented in accordance with the disclosed embodiments.

FIG. 6 illustrates an exemplary high level flow chart of operations illustrating logical operational steps of a method for forming an Electronic Flight Bag Retention Device. As indicated at block 201, the method is started and a rigid substrate for the retention of the EFB is formed, as indicated at block 202. Block 203 illustrates the forming of a plurality of retention clips on the edges of the rigid substrate. As illustrated at block 204, two elongated slots are formed within the rigid substrate for the insertion of the aircraft side window clipboard spring clip. Block 205 illustrates the creation of an angled weight support member on a top edge of the rigid substrate and the steps end as illustrated at block 206.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A retention device for a tablet computer, wherein the retention device retains the tablet computer in either landscape or portrait mode, the retention device comprising:
   a rigid substrate comprising a top, bottom, left right, front, and back; and
   three non-moving retention clips comprising a left retention clip permanently fixed to the left side of the substrate, a right retention clip permanently fixed to the right side of the substrate, and a bottom retention clip permanently fixed to the bottom of the substrate, wherein the retention clips are sized to hold the tablet computer by friction, wherein the substrate is sized such that the tablet computer is retained by the bottom retention clip and the left retention clip or by the bottom retention clip and the right retention clip but never by both the left retention clip and the right retention clip at the same time, and wherein the weight support element and the substrate are formed of the same piece.

2. The retention device of claim 1, further comprising a non-moving weight support member wherein the weight support member is permanently fixed to the top of the substrate and extends from the substrate to form an angle with the substrate.

3. The retention device of claim 2 wherein the retention clips and the substrate are formed of the same piece.

4. The retention device of claim 3 further comprising two slots comprising a left slot and a right slot, wherein the slots extend from the top of the substrate toward the bottom of the substrate, wherein the tablet computer does not occlude the right slot when the tablet computer is retained by the bottom retention clip and the left retention clip, and wherein the tablet computer does not occlude the left slot when the tablet computer is retained by the bottom retention clip and the right retention clip.

5. The retention device of claim 4 wherein the slots also extend into the weight support element.

6. The retention device of claim 5 wherein the slots are sized to accommodate the full length of a clipboard clip, wherein a clipboard comprises the clip board clip, wherein the clip holds the retention device to the clipboard when the clip is within one of the slots.

7. The retention device of claim 6 wherein the substrate is configured such that the clipboard clip does not contact the tablet computer.

8. The retention device of claim 6 wherein each of the retention clips comprise an inside surface and wherein the retention device further comprises padding applied to the inside surface of the retention clips.

9. The retention device of claim 7 comprising additional padding applied to the front of the substrate.

10. The retention device of claim 1 wherein each of the retention clips comprise an inside surface and wherein the retention device further comprises padding applied to the inside surface of the retention clips.

11. The retention device of claim 10 comprising additional padding applied to the front of the substrate.

12. The retention device of claim 11 further comprising two slots comprising a left slot and a right slot, wherein the slots extend from the top of the substrate toward the bottom of the substrate, wherein the tablet computer does not occlude the right slot when the tablet computer is retained by the bottom retention clip and the left retention clip, and wherein the tablet computer does not occlude the left slot when the tablet computer is retained by the bottom retention clip and the right retention clip.

13. The retention device of claim 12 wherein the slots are sized to accommodate the full length of a clipboard clip, wherein a clipboard comprises the clip board clip, wherein the clip holds the retention device to the clipboard when the clip is within one of the slots.

14. The retention device of claim 11 wherein the substrate is configured such that the clipboard clip does not contact the tablet computer.

15. The retention device of claim 1 wherein the retention device is sized and configured to stay in one position and to retain the tablet computer in landscape mode and in portrait mode.

16. A retention device for a tablet computer, wherein the retention device retains the tablet computer in either landscape or portrait mode, the retention device comprising:

a rigid substrate comprising a top, bottom, left right, front, and back;

three non-moving retention clips comprising a left retention clip permanently fixed to the left side of the substrate, a right retention clip permanently fixed to the right side of the substrate, and a bottom retention clip permanently fixed to the bottom of the substrate, wherein the retention clips are sized to hold the tablet computer by friction, wherein the substrate is sized such that the tablet computer is retained by the bottom retention clip and the left retention clip or by the bottom retention clip and the right retention clip but never by both the left retention clip and the right retention clip at the same time; and two slots comprising a left slot and a right slot, wherein the slots extend from the top of the substrate toward the bottom of the substrate, wherein the tablet computer does not occlude the right slot when the tablet computer is retained by the bottom retention clip and the left retention clip, and wherein the tablet computer does not occlude the left slot when the tablet computer is retained by the bottom retention clip and the right retention clip.

17. The retention device of claim 16 wherein the slots are sized to accommodate the full length of a clipboard clip, wherein a clipboard comprises the clip board clip, wherein the clip holds the retention device to the clipboard when the clip is within one of the slots.

18. The retention device of claim 17 wherein the substrate is configured such that the clipboard clip does not contact the tablet computer.

* * * * *